(12) United States Patent
Thomas et al.

(10) Patent No.: US 12,183,739 B2
(45) Date of Patent: Dec. 31, 2024

(54) RIBBON OR WIRE TRANSISTOR STACK WITH SELECTIVE DIPOLE THRESHOLD VOLTAGE SHIFTER

(71) Applicant: Intel Corporation, Santa Clara, CA (US)

(72) Inventors: Nicole Thomas, Portland, OR (US); Eric Mattson, Portland, OR (US); Sudarat Lee, Hillsboro, OR (US); Scott B. Clendenning, Portland, OR (US); Tobias Brown-Heft, Portland, OR (US); I-Cheng Tung, Hillsboro, OR (US); Thoe Michaelos, Portland, OR (US); Gilbert Dewey, Beaverton, OR (US); Charles Kuo, Hillsboro, OR (US); Matthew Metz, Portland, OR (US); Marko Radosavljevic, Portland, OR (US); Charles Mokhtarzadeh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 17/127,280

(22) Filed: Dec. 18, 2020

(65) Prior Publication Data

US 2022/0199620 A1 Jun. 23, 2022

(51) Int. Cl.
*H01L 27/092* (2006.01)
*H01L 21/02* (2006.01)
(Continued)

(52) U.S. Cl.
CPC .... *H01L 27/0922* (2013.01); *H01L 21/02532* (2013.01); *H01L 21/02603* (2013.01);
(Continued)

(58) Field of Classification Search
CPC .......... H01L 27/0922; H01L 21/02532; H01L 21/02603; H01L 21/28185;
(Continued)

(56) References Cited

U.S. PATENT DOCUMENTS 10,825,736 B1 * 11/2020 Zhang .................. H01L 29/775
2005/0214998 A1 9/2005 Chen et al.
(Continued)

OTHER PUBLICATIONS

Extended European Search Report from European Patent Application No. 21197586.7 notified Feb. 25, 2022, 13 pgs.
(Continued)

*Primary Examiner* — Bitew A Dinke
(74) *Attorney, Agent, or Firm* — Essential Patents Group, LLP

(57) ABSTRACT

Integrated circuitry comprising a ribbon or wire (RoW) transistor stack within which the transistors have different threshold voltages ($V_t$). In some examples, a gate electrode of the transistor stack may include only one workfunction metal. A metal oxide may be deposited around one or more channels of the transistor stack as a solid-state source of a metal oxide species that will diffuse toward the channel region(s). As diffused, the metal oxide may remain (e.g., as a silicate, or hafnate) in close proximity to the channel region, thereby altering the dipole properties of the gate insulator material. Different channels of a transistor stack may be exposed to differing amounts or types of the metal oxide species to provide a range of $V_t$ within the stack. After diffusion, the metal oxide may be stripped as sacrificial, or retained.

21 Claims, 10 Drawing Sheets

(51) Int. Cl.
| | |
|---|---|
| H01L 21/28 | (2006.01) |
| H01L 21/8238 | (2006.01) |
| H01L 29/06 | (2006.01) |
| H01L 29/423 | (2006.01) |
| H01L 29/49 | (2006.01) |
| H01L 29/66 | (2006.01) |
| H01L 29/78 | (2006.01) |
| H01L 29/786 | (2006.01) |

(52) U.S. Cl.
CPC .. *H01L 21/28185* (2013.01); *H01L 21/28255* (2013.01); *H01L 21/823807* (2013.01); *H01L 21/823828* (2013.01); *H01L 21/823857* (2013.01); *H01L 29/0673* (2013.01); *H01L 29/42392* (2013.01); *H01L 29/4908* (2013.01); *H01L 29/66742* (2013.01); *H01L 29/6684* (2013.01); *H01L 29/78391* (2014.09); *H01L 29/78618* (2013.01); *H01L 29/78696* (2013.01)

(58) Field of Classification Search
CPC ....... H01L 21/28255; H01L 21/823807; H01L 21/823828; H01L 21/823857; H01L 29/0673; H01L 29/42392; H01L 29/4908; H01L 29/66742; H01L 29/6684; H01L 29/78391; H01L 29/78618; H01L 29/78696; H01L 21/8221; H01L 27/0688; H01L 27/092; H01L 29/517; H01L 29/66439; H01L 29/775; H01L 29/7856; H01L 29/785; B82Y 10/00
See application file for complete search history.

(56) References Cited

U.S. PATENT DOCUMENTS

| | | | |
|---|---|---|---|
| 2007/0045713 A1 | 3/2007 | Ono et al. | |
| 2008/0102607 A1 | 5/2008 | Passlack et al. | |
| 2011/0254013 A1* | 10/2011 | Xiao | H01L 21/84 257/369 |
| 2012/0139062 A1 | 6/2012 | Yuan et al. | |
| 2013/0062704 A1 | 3/2013 | Cheng et al. | |
| 2013/0181277 A1 | 7/2013 | Wu et al. | |
| 2015/0123167 A1* | 5/2015 | Ji | H01L 21/28202 257/192 |
| 2016/0049491 A1 | 2/2016 | Lin et al. | |
| 2016/0148934 A1* | 5/2016 | Ji | H01L 29/517 257/369 |
| 2017/0053915 A1 | 2/2017 | Ando et al. | |
| 2017/0053930 A1 | 2/2017 | Prinz et al. | |
| 2017/0092723 A1 | 3/2017 | Ando et al. | |
| 2019/0088798 A1 | 3/2019 | Kim et al. | |
| 2019/0196830 A1* | 6/2019 | Lilak | G06F 9/30014 |
| 2020/0006479 A1* | 1/2020 | Reznicek | H01L 29/42392 |
| 2020/0105751 A1* | 4/2020 | Dewey | H01L 21/8256 |
| 2020/0219970 A1* | 7/2020 | Mannebach | H01L 29/66795 |
| 2020/0219979 A1 | 7/2020 | Rachmady et al. | |
| 2020/0266218 A1* | 8/2020 | Lilak | H01L 21/823437 |
| 2020/0294969 A1* | 9/2020 | Rachmady | H01L 27/088 |
| 2020/0295127 A1* | 9/2020 | Mannebach | H01L 24/17 |
| 2020/0373300 A1* | 11/2020 | Zhang | H01L 21/28158 |
| 2021/0005604 A1* | 1/2021 | Ge | H01L 21/0337 |
| 2021/0210388 A1* | 7/2021 | Zhang | H01L 29/66439 |
| 2021/0305400 A1* | 9/2021 | Hsu | H01L 29/513 |
| 2021/0366783 A1* | 11/2021 | Chu | H01L 29/78696 |
| 2021/0391220 A1* | 12/2021 | Savant | H01L 21/823857 |
| 2021/0391225 A1* | 12/2021 | Cheng | H01L 29/517 |
| 2021/0391439 A1* | 12/2021 | Pao | H01L 21/02181 |
| 2022/0199472 A1 | 6/2022 | Chao et al. | |
| 2022/0199620 A1 | 6/2022 | Thomas et al. | |
| 2022/0199796 A1* | 6/2022 | Zhang | H01L 29/0665 |
| 2023/0209799 A1 | 6/2023 | Ong et al. | |

OTHER PUBLICATIONS

Bao, R., et al., "Selective Enablement of Dual Dipoles for Near Bandedge Multi-Vt Solution in High Performance FinFET and Nanosheet Technologies", 2020 Symposium on VLSI Technology Digest of Technical Papers, 2 pgs.

Chung, Wonil, et al., "Integration of ALD high-k dipole layers into CMOS SOI nanowire FETs for bi-directional threshold voltage engineering", 2020 IEEE Silicon Nanoelectronics Workshop, 2 pgs.

Bao, R., et al., "Multiple-Vt Solutions in Nanosheet Technology for High Performance and Low Power Applications", 2019 IEEE International Electron Devices Meeting (IEDM), 4 pgs.

Bao, R., et al., "Selective Enablement of Dual Dipoles for Near Bandedge Multi-VT Solution in High Performance in FinFET and Nanosheet Technologies", 2020 Symposium on VLSI Technology Digest of Technical Papers, 2 pgs.

* cited by examiner

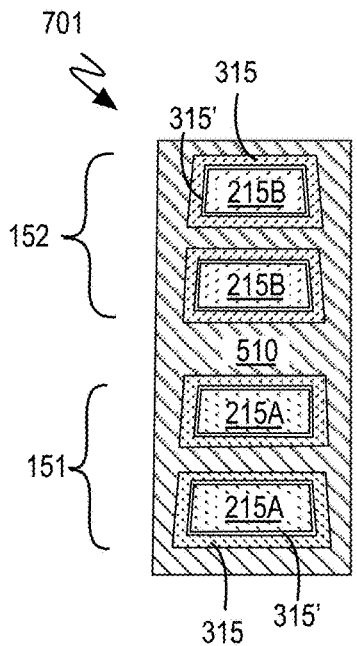 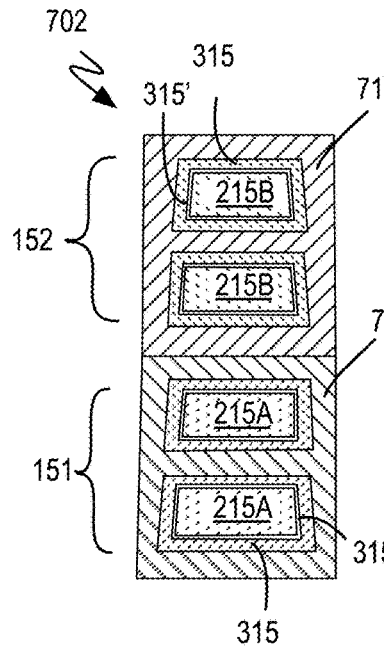 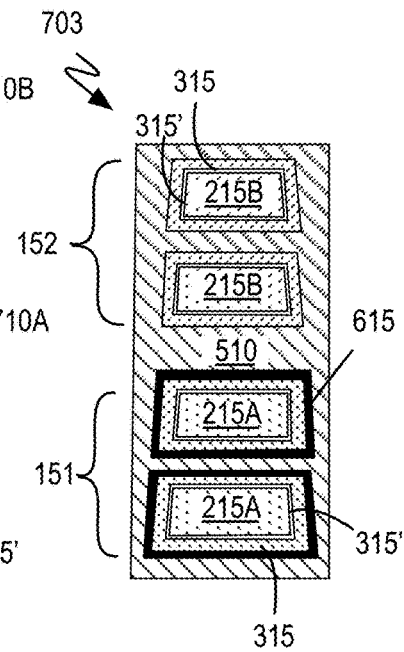
FIG. 7A  FIG. 7B  FIG. 7C
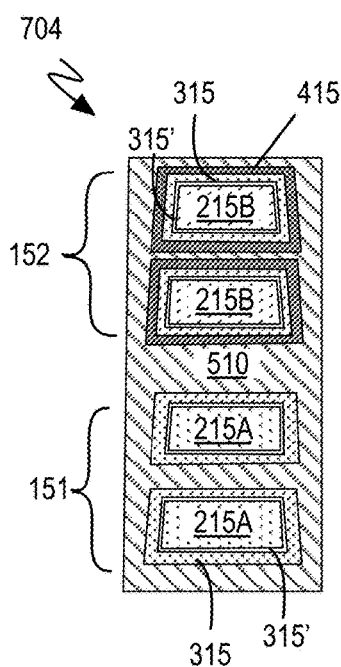 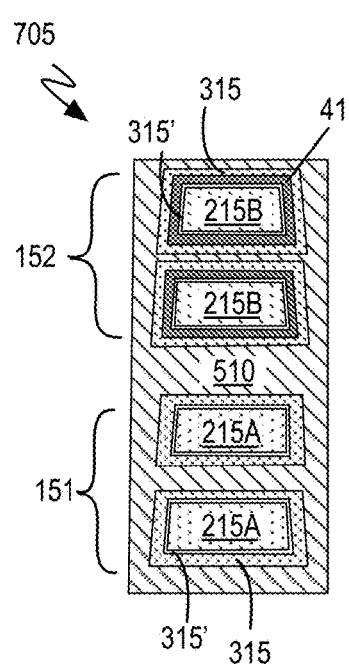 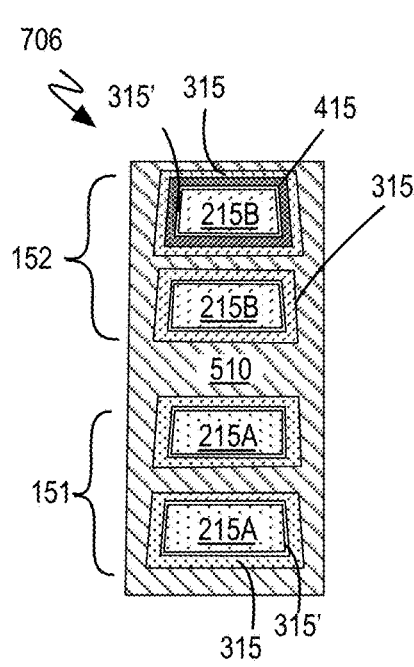
FIG. 7D  FIG. 7E  FIG. 7F

RIBBON OR WIRE TRANSISTOR STACK WITH SELECTIVE DIPOLE THRESHOLD VOLTAGE SHIFTER

BACKGROUND

Demand for higher performance integrated circuits (ICs) in electronic device applications has motivated increasingly dense transistor architectures. Stacked gate-all-around (GAA) transistor structures, such as ribbon or wire (RoW) structures, include a plurality of channel regions that are in a vertical stack with one channel over another.

For any transistor architecture, it is advantageous to be able to set the transistor threshold voltage ($V_t$). According to convention, $V_t$ tuning may be accomplished through one or more of depositing a particular work function metal as part of a gate electrode, or varying the thickness of one or more metals of a gate electrode, for example. If multiple threshold voltages are desired in an IC, the IC fabrication process must accommodate multiple work function metals and/or metal layer thicknesses.

For GAA transistor structures, and particularly for stacked RoW transistor architectures, the device geometry and/or small spaces between stacked channel regions may limit a work function metal to a thickness that is insufficient to strongly set $V_t$, and/or may preclude the use of multiple work function metals and/or metal layer thicknesses within a single transistor stack. Fabrication techniques and RoW transistor stack architectures that enable $V_t$ tuning for transistors within the stack for even the most aggressively scaled devices are therefore commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 7A, 7B, 7C, 7D, 7E and 7F illustrate cross-sectional views of ROW transistor stack structures, in accordance with some embodiments;

DETAILED DESCRIPTION

Figure 1:
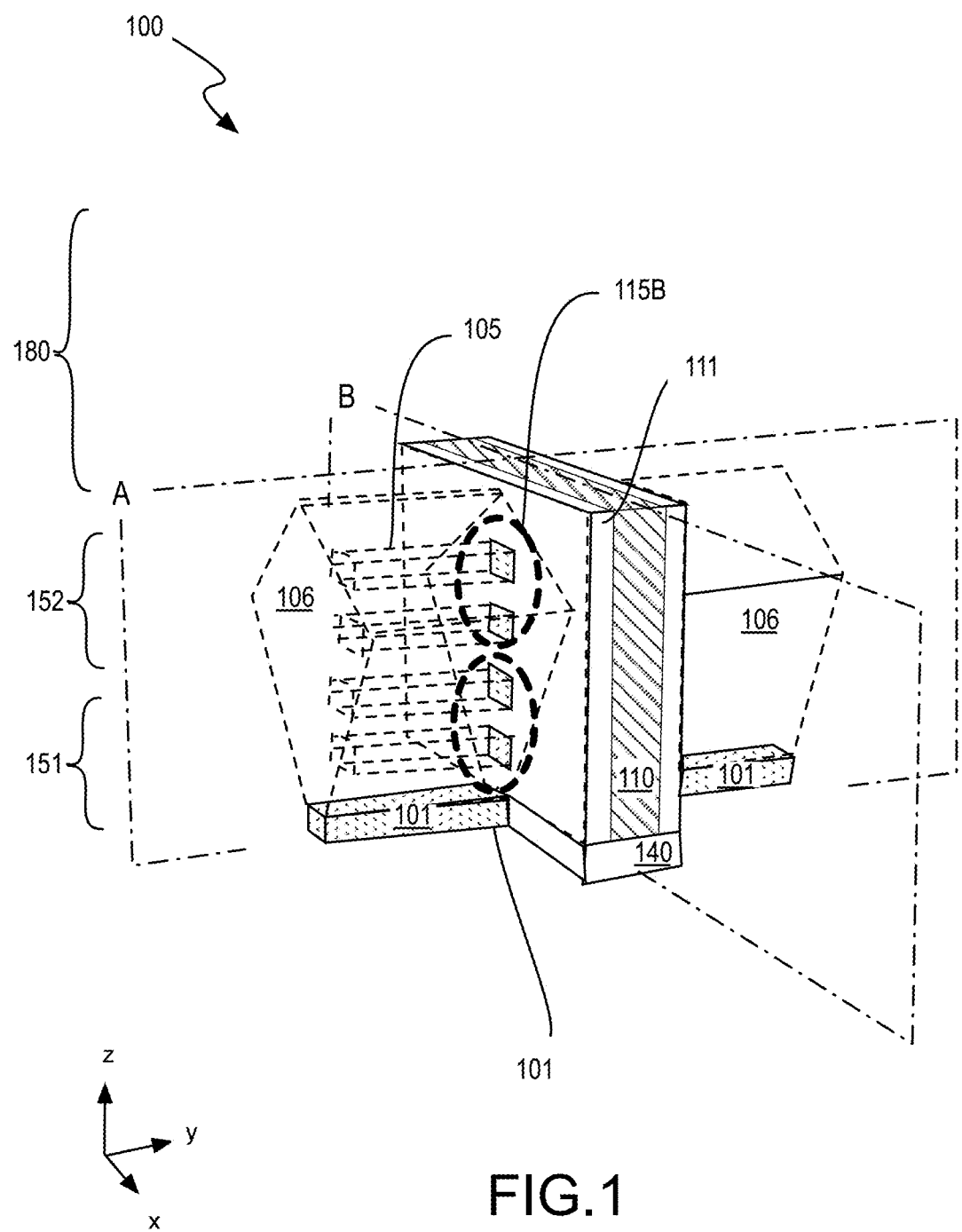
FIG. 1 illustrates an isometric sectional view of a RoW transistor stack structure including at least one dipole $V_t$ shifter, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a metallic compound may be formed around one or more channels of a transistor stack as a solid-state source of a dipole species that can be diffused toward the channel region during an IC fabrication process. The metallic compound is of a composition distinct from one employed as a high-k gate insulator. As diffused, the dipole species may remain (e.g., as a silicate, or hafnate) in close proximity to the channel material, thereby altering the dipole properties of the gate insulator material. A metallic dipole species introduced in accordance with embodiments herein may offer good thermally stability. Different channels of a transistor stack may be exposed to differing amounts or types of the metallic dipole species to provide a range of $V_t$ within a transistor stack. Where a transistor stack is a CMOS stack structure that includes both P-type and N-type transistors, $V_t$ for the complementary conductivity types may be differentiated, at least in part, by the metallic dipole species. After diffusion, the metallic compound source material may be stripped as sacrificial, or retained within a transistor stack structure as part of a gate stack.

FIG. 1 illustrates an isometric sectional view of a RoW transistor stack structure 100 including at least one dipole $V_t$ shifter, in accordance with some embodiments. RoW transistor stack structure 100 has a GAA transistor architecture with a plurality of stacked channel regions. RoW transistor stack structure 100 is illustrated as including four active channel regions, but a RoW transistor stack structure may include any integer number of channel regions (e.g., 2, 3, 4, 5 . . . 10 . . . 20, etc.) as embodiments herein are not limited in this respect.

RoW transistor stack structure 100 comprises a plurality of transistors 151 and 152. In the illustrated example, transistor 151 comprises a plurality of RoW channel regions 115A (encircled by a first heavy dashed line), and transistor 152 includes a plurality of RoW channel regions 115B (encircled by a second heavy dashed line). Although two channel regions are illustrated for each of transistors 151 and 152, transistors within a stack may include any integer number of channel regions (e.g., 1, 2 . . . 5 . . . 10, etc.). Transistor 151 is distinguished from transistor 152 by at least a difference in their threshold voltages. Transistors 151 and 152 may also have other distinctions.

In accordance with some embodiments, RoW transistor stack structure 100 is a CMOS RoW transistor stack where transistor 151 is of a first conductivity type, and transistor 152 is of a second, complementary, conductivity type. Transistors 151 and 152 may each be of either positive or negative conductivity type such that channel regions 115A or 115B may each be portions of either a P-type or N-type transistor. In some exemplary embodiments, channel regions 115A are portions of P-type transistors while channel regions 115B are portions of N-type transistors. Source and drain regions 106 are coupled together through channel regions 115A and 115B. In such a CMOS transistor stack, each of channel regions 115A may be operable to contribute to a total drive current of (e.g., a PMOS) transistor 151. Each of channel regions 115B may be operable to contribute to a total drive current of (e.g., an NMOS) transistor 152.

As described further below, a dipole $V_t$ shifter may be introduced into a gate insulator material to surround at least one of channel regions 115A or 115B and thereby modulate the transistor threshold voltage. In some embodiments, for example, a P-type dipole $V_t$ shifter is present only around P-type channel regions 115A. The threshold voltage of transistors with channel regions 115B would then be primarily a function of the workfunction metal while the threshold voltage of transistors with the channel regions 115A would be a function of both the workfunction metal and the dipole $V_t$ shifter. In some other embodiments, an N-type dipole $V_t$ shifter is present only around N-type channel regions 115B. The threshold voltage of transistors with channel regions 115A would then be primarily a function of the workfunction metal while the threshold voltage of transistors with the channel regions 115B would be a function of both the workfunction metal and the dipole $V_t$ shifter. In other embodiments, different (e.g., complementary) dipole shifters surround channel regions 115A and 115B. In other embodiments, different non-zero amounts of dipole shifters surround channel regions 115A and/or channel regions 115B. In still other embodiments, both P-type and N-type dipole $V_t$ shifters may be present within at least one of channel regions 115A and 115B.

In accordance with some other embodiments, RoW transistor stack structure 100 is a PMOS RoW transistor stack. For such embodiments, transistor 151 is a PMOS transistor with a first $V_t$, for example dependent on of the presence or absence of a P-type dipole $V_t$ shifter around channel regions 115A, while transistor 152 is a PMOS transistor with a second $V_t$, for example dependent on the presence or absence of a P-type dipole shifter around channel regions 115B. If present, a P-type dipole shifter around channel regions 115A may be the same or different than a P-type dipole shifter surrounding channel regions 115B. RoW transistor stack structure 100 may likewise instead be an NMOS RoW transistors stack. For such embodiments, transistor 151 may be an NMOS transistor with a first $V_t$, for example dependent on the presence or absence of an N-type dipole $V_t$ shifter around channel regions 115A, while transistor 152 an NMOS transistor with a second $V_t$, for example dependent on the presence or absence of an N-type dipole shifter around channel region 115B. If present, an N-type dipole $V_t$ shifter around channel regions 115A may be the same or different than an N-type dipole $V_t$ shifter surrounding channel regions 115B.

As further illustrated in FIG. 1, channel regions 115A, 115B may be over a sub-channel material 101, which may have been part of a workpiece substrate, such as a large format semiconductor wafer, for example. An integrated circuit including RoW transistor stack structure 100 may include any number of metallization levels 180 over a "top" or "front" side of transistor structure 100, for example. Metallization levels 180 may have any known structure, and any number of levels interconnecting one or more transistor terminals with other nodes in a circuit. However, structural aspects of substrate material 101 and metallization levels 180 are not depicted in FIG. 1 to avoid obscuring the view of RoW transistor stack structure 100. It is in reference to substrate 101 and/or metallization levels 180, that channel regions 115A may be referred to herein as "lower," channel regions while channel regions 115B are may be referred to herein as "upper," channel regions.

In FIG. 1, two orthogonal planes A and B are demarked by dashed line. Plane A is a "gate-cut" plane that passes through a transverse width of gate electrode 110 and passes through a longitudinal length of channel regions 115A, 115B. Plane B is a "fin-cut" plane that passes through a transverse width of channel regions 115A, 115B and passes through a longitudinal length of gate electrode 110. As further illustrated, source and drain regions 106 are electrically and physically coupled to opposite sides of channel regions 115A, 115B. In this example, source and drain regions 106 comprise faceted epitaxial material that has been grown, for example laterally from an end portion of channel regions 115A, 115B embedded with in a spacer dielectric material 111, and/or from cantilevered source/drain nanowire ends (e.g., 105) drawn in dashed line, and/or from sub-channel region 101. For CMOS RoW transistor stacks, source and drain regions 106 may comprise both P-type (e.g., lower) and N-type (upper) portions associated with each of transistors 151 and 152. For PMOS RoW transistor stacks where transistors 151 and 152 are both PMOS, source and drain regions 106 may be homogenously P-type. For NMOS RoW transistor stacks where transistors 151 and 152 are both NMOS, source and drain regions 106 may be homogenously N-type.

Source and drain regions 106 need not be epitaxial material, in which case the facets shown in FIG. 1 may not be present. Source and drain regions 106 also need not be merged into a unitary body, in which case cantilevered source/drain nanowire ends (e.g., 105) may be individually contacted by a terminal contact metal. Although not depicted for the sake of clarity, metallization levels 180 may include a source and/or drain contact that is similarly in contact with source and drain regions 106. Likewise, front-side metallization levels 180 may further include a contact (not depicted) to gate electrode 110.

Gate electrode 110 is between source and drain region 106, with intervening spacer dielectric material 111 between gate electrode 110 and source and drain regions 106. RoW transistor stack structure 100 may further include one or more additional dielectric materials. In the illustrated example, there is a dielectric material 140 under gate electrode 110 where gate electrode 110 extends laterally beyond channel regions 115A, 115B. Other dielectric material 140 (not depicted) may surround source and drain regions 106, as well as gate electrode 110.

Figure 2A:
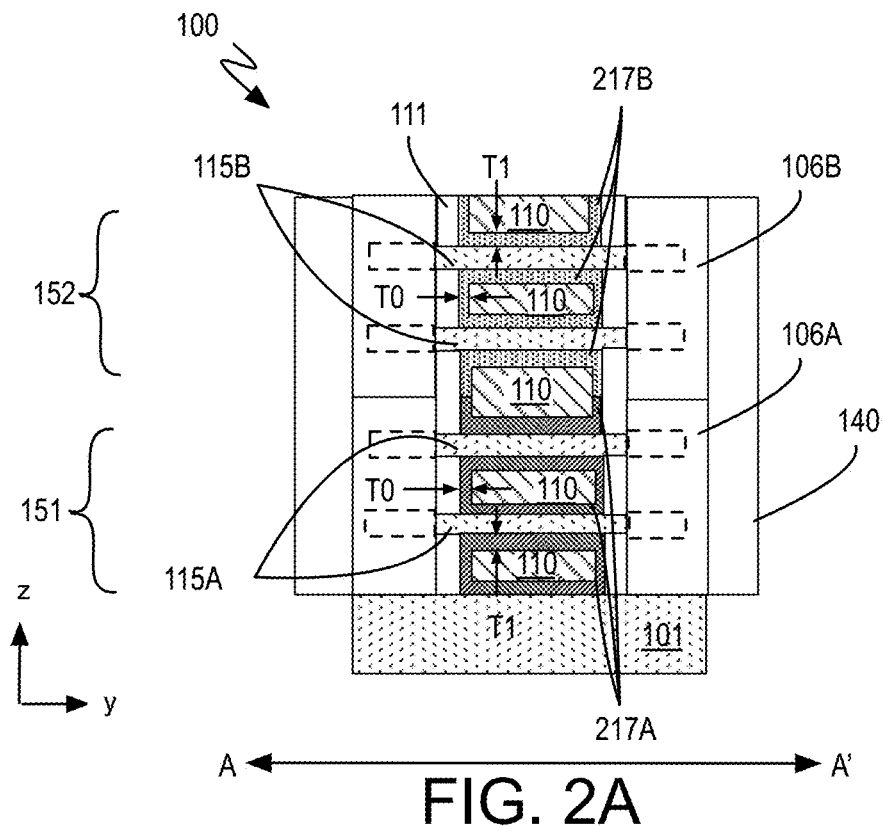
FIG. 2A illustrates a first cross-sectional view of the RoW transistor stack structure introduced in FIG. 1, in accordance with some embodiments.
Figure 2B:
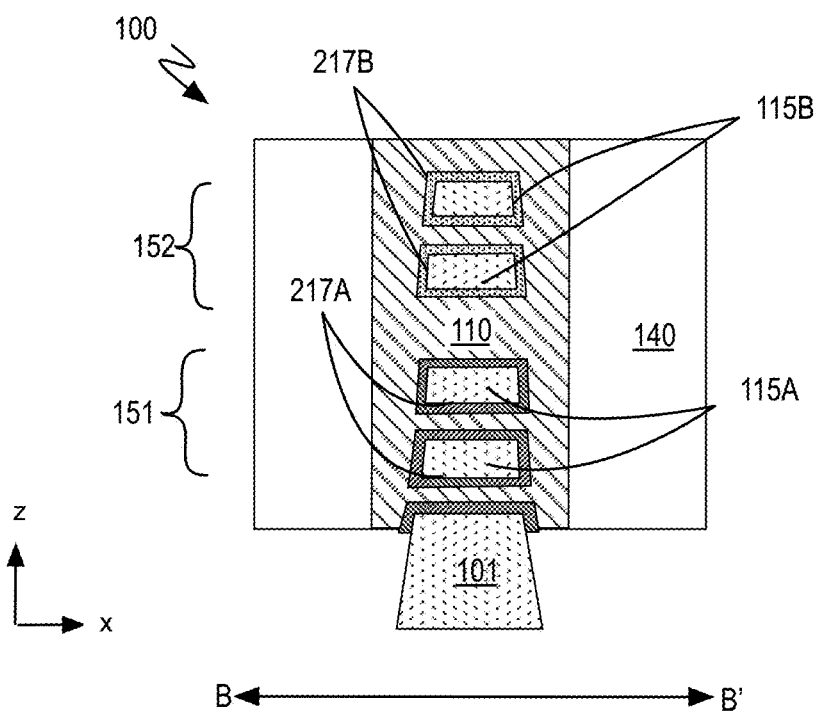
FIG. 2B illustrates a second cross-sectional view of the RoW transistor stack structure introduced in FIG. 1, in accordance with some embodiments.

FIG. 2A illustrates a cross-sectional view of RoW transistor stack structure 100 along the A-A' plane introduced in FIG. 1, in accordance with some embodiments. FIG. 2B illustrates a second cross-sectional view of RoW transistor stack structure 100 along the B-B' plane introduced in FIG. 1, in accordance with some embodiments.

As shown in FIG. 2A, channel regions 115A, 115B have a longitudinal channel length (e.g., along y-axis) associated with a distance between source and drain regions 106. Channel regions 115A, 115B may extend through dielectric spacer 111, as illustrated in FIG. 2A Channel regions 115A, 115B are bodies of semiconductor material that may have been patterned from a fin of a substrate material layer, for example. The trapezoidal profiles of channel regions 115A, 115B illustrated in FIG. 2B are representative of structural asymmetry associated with front-side transistor fabrication. Such asymmetry may be a result of feature sidewall slopes that evolve during subtractive patterning of a semiconductor fin, for example. Although channel regions 115A, 115B are illustrated in FIG. 2B as nanoribbons having a transverse width greater than their vertical thickness, channel regions 115A, 115B may instead be nanowires of substantially equal vertical thickness and lateral width.

In some embodiments, channel regions 115A, 115B are crystalline semiconductor. Although the crystalline semiconductor includes polycrystalline thin film material, the crystalline semiconductor may be advantageously substantially monocrystalline. In some such embodiments, the crystallinity of channel regions 115A, 115B is cubic with the top surfaces nearest to metallization levels 180 having crystallographic orientation of (100), (111), or (110), for example. Other crystallographic orientations are also possible. In some embodiments, channel regions 115A, 115B are a substantially monocrystalline group IV semiconductor material, such as, but not limited to substantially pure silicon (e.g., having only trace impurities), silicon alloys (e.g., SiGe), or substantially pure germanium (e.g., having only trace impurities) Channel regions 115A, 115B may also have any of these same exemplary compositions in alternative polycrystalline or amorphous embodiments, for example where RoW transistor stack structure 100 has been fabricated from a thin film semiconductor material layer. Polycrystalline or amorphous embodiments of channel regions 115A and 115B may also include semiconducting metal oxides, such as IGZO. Although channel regions 115A, 115B are illustrated as having a substantially homogenous composition, they may alternatively comprise one or more semiconductor heterojunctions that, for example further include a first semiconductor material adjacent to a second semiconductor material.

Source/drain regions 106 may similarly comprise any semiconductor material suitable for a transistor. In some embodiments, semiconductor material of source/drain regions 106 includes impurity-doped portions of semiconductor material protruding laterally beyond channel regions 115A, 115B as denoted by dashed lines in FIG. 2A. In the illustrated embodiment, source/drain regions 106 include a unified epitaxial semiconductor source/drain structure. Source/drain regions 106 may be comprise one or more electrically active impurities. In some embodiments, for example, source/drain regions 106 are a Group IV semiconductor material (e.g., Si, Ge, or SiGe alloy) with at least one of a p-type impurity (e.g., boron or gallium) or an n-type impurity (e.g., phosphorus, arsenic, or antimony). In exemplary CMOS RoW transistor stack structures, source/drain regions 106 include both a p-type portion (e.g., 106A) and an n-type portion (e.g., 106B).

As further illustrated in FIG. 2A and FIG. 2B, sub-channel material 101 is under the stack of channel regions 115A, 115B, under gate electrode 110, and may be a base of a fin, for example, from which channel regions 115A, 115B were formed. As such, sub-channel material 101 may have a composition and/or microstructure similar to channel regions 115A, 115B. For example, in some embodiments where channel regions 115A, 115B are of a Group IV material (e.g., silicon), sub-channel material 101 is also a Group IV material (e.g., silicon). In some further embodiments where channel regions 115A, 115B are substantially monocrystalline, sub-channel material 101 is also substantially monocrystalline, and has the same crystallinity and/or crystal orientation as that of channel regions 115A, 115B. In alternative embodiments, sub-channel material 101 is a buried insulator layer (e.g., $SiO_2$), for example of a semiconductor-on-insulator (SOI) substrate.

As further shown in FIG. 2A and FIG. 2B, RoW transistor stack structure 100 includes a gate stack comprising gate electrode 110 and a gate insulator 217 cladding channel regions 115A, 115B to provide gate-all-around control of channel conductivity. In the illustrated embodiment, the gate electrode 110 is a single homogeneous material. For such embodiments, the single homogenous material is a single workfunction metal. In some embodiments, gate electrode 110 includes only an n-type workfunction metal, which may have a workfunction between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). In some other embodiments, gate electrode 110 includes only a p-type workfunction metal, which may have a workfunction between about 4.9 eV and about 5.2 eV, for example. Suitable p-type materials include, but are not limited to, ruthenium, palladium, platinum, cobalt, nickel titanium, tungsten, conductive metal nitrides (e.g., TiN, WN), and conductive metal oxides (e.g., ruthenium oxide). In still other embodiments, gate electrode 110 may instead include only a mid-gap workfunction metal having a workfunction between those of the n-type and p-type workfunction metals (e.g., 4.2-4.9 eV). Although not illustrated in FIG. 2A, or 2B, a compositionally distinct gate fill metal may be over the workfunction metal where a thickness of the workfunction metal is insufficient to occupy the topography allocated to gate electrode 110. Although embodiments with a single workfunction metal may be advantageous for greater ease of manufacture, gate electrode 110 may instead comprise multiple workfunction metals. For example, as described further below, gate electrode 110A may comprise any one of the n-type or p-type workfunction metals described above in combination with any other of the n-type or p-type workfunction metals. For a CMOS RoW transistor stack structure, gate electrode 110A may more specifically include any one of the n-type workfunction metals described above in combination with any one of the p-type workfunction metals.

As further illustrated in FIGS. 2A and 2B, transistor stack structure 100 includes a gate insulator 217A completely surrounding channel regions 115A, and a gate insulator 217B completely surrounding channel regions 115B. Gate insulators 217A and 217B are therefore between gate electrode 110 and channel regions 115A and 115B, respectively. In accordance with some exemplary embodiments, both of gate insulators 217A and 217B include a high-k material (with a bulk relative permittivity greater than 8). This high-k material may advantageously have substantially the same chemical composition for both gate insulator 217A and 217B. While both gate insulators 217A and 217B may be the same high-k material, the two gate insulators differ in an amount of a dipole $V_t$ shifter present. In exemplary embodiments, the dipole $V_t$ shifter is one or more metallic compounds that further include a supplemental metal that is distinct from any other metal that may be present in the high-k material included in both gate insulators 217A and 217B.

The chemical compositions of gate insulators 217A and 217B shown in FIGS. 2A and 2B are therefore different by at least the amount (concentration) of this dipole metal. While more of the dipole metal may be present in either gate insulator 217A or 217B, the varying amount of the dipole species including this dipole metal advantageously varies the threshold voltage of transistor 151 from that of transistor 152. The resulting variation in $V_t$ may be sufficient to enable gate electrode 110 to include a single workfunction metal, even where transistors 151 and 152 are of complementary conductivity type. Alternatively, variation in $V_t$ attributable to the variation in the amount of dipole metal across gate insulators 217A and 217B augments any variation in $V_t$ attributable to other distinctions between transistors 151 and 152, such as for embodiments where gate electrode 110 instead includes multiple (e.g., two) workfunction metals.

As further shown in FIG. 2A, gate insulator 217A, 217B have a thickness T1 between channel regions 115A, 115B and gate electrode 110. In the illustrated example thickness T1 is greater than a deposited insulator material thickness T0, which is present between sidewalls of gate electrode 110 and spacer 111. The difference in thickness between T1 and T0 is attributable to a thermal (chemical) oxide that may be present only on surfaces of channel regions 115,A, 115B. Hence, gate insulator 217B includes both a chemical oxide layer and a high-k material layer, but this stack may be present only over surfaces of channels 115A, 115B because the chemical oxide is selectively formed on only channel regions 115A, 115B.

Figure 3:
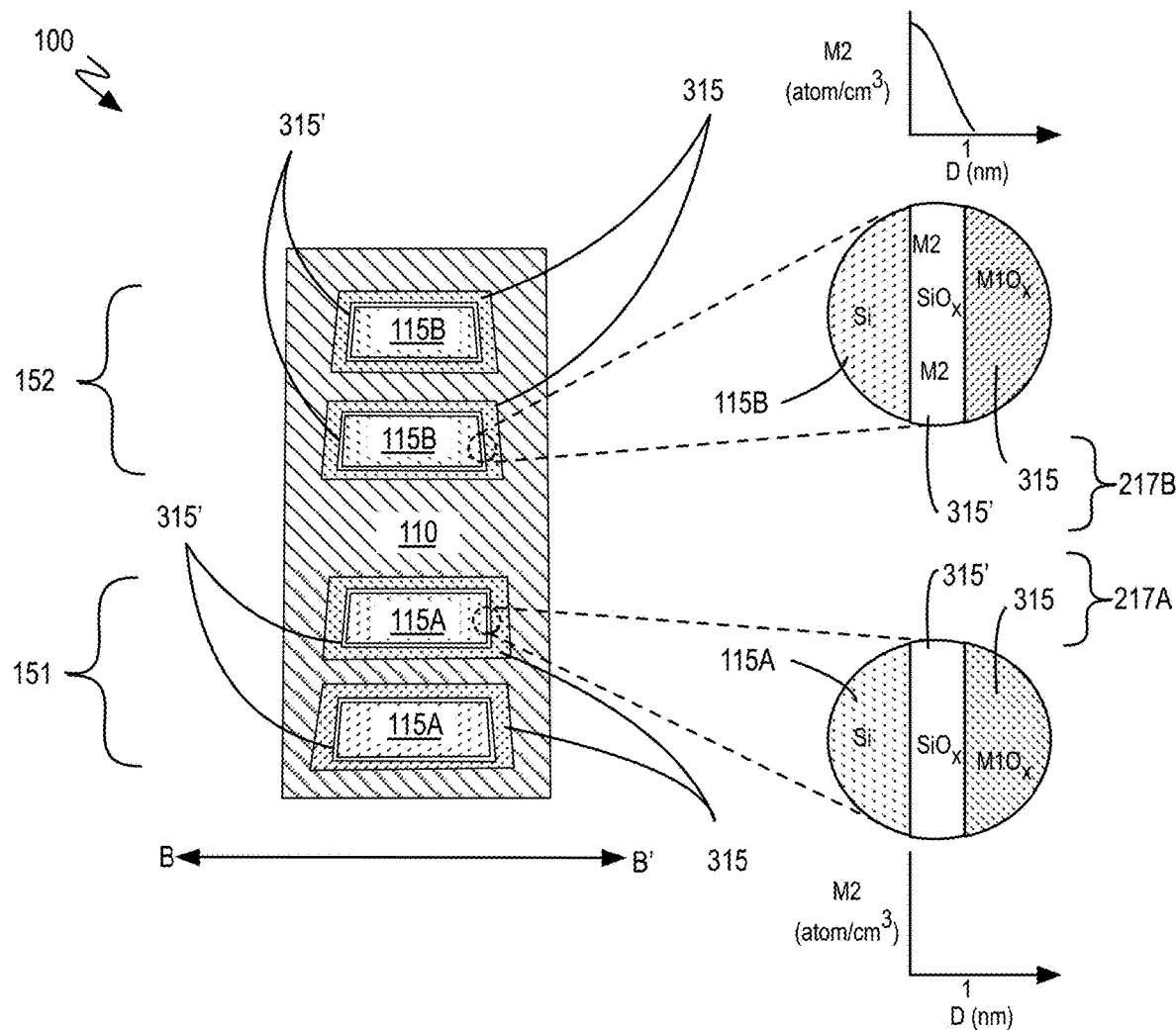
FIG. 3 illustrates an expanded cross-sectional view the RoW transistor stack structure introduced in FIG. 1, in accordance with some embodiments.

FIG. 3 illustrates an expanded cross-sectional view RoW transistor stack structure 100, in accordance with some embodiments. As shown, gate insulator 217A includes a high-k material 315 surrounding a native, or chemical oxide material 315' that is in direct contact with channel region 115A. For exemplary embodiments where channel region 115A comprises silicon (e.g., pure Si or an alloy), chemical oxide material 315' includes both Si and oxygen (e.g., $SiO_x$) and may have any thickness, but is advantageously less than 1.5 nm and more advantageously less than 1.0 nm. Elements other than silicon may be present within chemical oxide material 315' for other channel compositions. For example, Ge may be present within chemical oxide material 315' for embodiments where the channel region comprises predominantly Ge.

High-k material 315 is in direct contact with chemical oxide material 315' and may have any composition known to be suitable as a transistor gate insulator that has a bulk relative permittivity greater than 8. One exemplary high-k material is metal oxide ($MlO_x$). Examples include a metal oxide comprising predominantly aluminum (e.g., $AlO_x$), a metal oxide comprising predominantly magnesium (e.g., MgO), a metal oxide comprising predominantly lanthanum (e.g., $LaO_x$), a metal oxide comprising predominantly hafnium (e.g., $HfO_x$) or predominantly zirconium (e.g., $ZrO_x$). In other examples, the high-k material is an alloy metal oxide comprising significant portions of two or more metals (e.g., $HfAlO_x$, or $HfZrO_x$). In some further embodiments, the high-k material further includes silicon. For example, metal silicates, such as, but not limited to $HfSiO_x$, $HfAlSiO_x$, HfZrSiO$_x$ may also be suitable a gate insulator for some channel compositions (e.g., Si, Ge, SiGe, III-V). Some specific examples of other high-k materials include lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate. Although the thickness of high-k material 315 may vary, in some exemplary embodiments it is no more than 2.0 nm, and may also be less than 1.0 nm.

As further illustrated in FIG. 3, gate insulator 217B similarly includes chemical oxide material 315' in contact with channel region 115, and high-k material 315 in contact with chemical oxide 315. As noted above, high-k material 315 may be substantially the same for both gate insulators 217A and 217B, for example both including metal oxide M1O$_x$. Gate insulator 217B differs from gate insulator 217A in the amount of a dipole V$_t$ shifter comprising a dipole metal M2. In the example shown, metal M2 is present within gate insulator 217B, but substantially absent from gate insulator 217A. In other embodiments, metal M2 is present within both gate insulators 217B and 217A, but the amount (concentration) of metal M2 is less in one or the other (e.g., less in gate insulator 217A than in gate insulator 217B).

In the specific example illustrated, metal M2 is present within chemical oxide material 315' and is therefore in very close proximity (e.g., with 1.0 nm) of channel region 115B, which may be advantageous for strongly affecting transistor V$_t$. However, metal M2 is substantially absent from chemical oxide material 315' that surrounds channel region 115A. With the amount of metal M2 varying between the two chemical oxide materials 315' (e.g., with only one of them comprising second metal M2), the two chemical oxide materials 315' compositionally differ between RoW transistors 151 and 152. For such embodiments, the two chemical oxide materials 315' may therefore be considered two different gate insulator materials.

As shown qualitatively in FIG. 3, the concentration of metal M2 within gate insulator 217B increases toward channel region 115B with metal M2 becoming undetectable within gate insulator 217B beyond about 1.0 nm from channel region 115B. Hence, in this example where chemical oxide material 315' is 1.0 nm, metal M2 is substantially absent from high-k material 315. However, metal M2 may also be present within high-k material 315 in addition to being present within chemical oxide material 315'. In some embodiments where metal M2 is present within high-k material 315, the concentration of metal M2 is less than that of metal M1. Hence, high-k material 315 may still be considered primarily M1O$_x$ with some metal M2 present in a dipole dopant. In other embodiments, metal M2 may also be present at detectable levels only within high-k material 315.

Metal M2 may be present either as non-ionic oxide (e.g., M2O$_x$) or as an ionic oxide, for example further comprising silicon (e.g., as a silicate) when metal M2 is within chemical oxide material 315', or further comprising metal M1 (e.g., as a hafnate) when metal M2 is within high-k material 315 (e.g., HfO$_x$). Metal M2 may be any metal that forms a stable dipole compound, including metals known to be suitable as high-k materials as well as metals that form compounds having somewhat lower dielectric constants. For example, any of the metals listed above as suitable choices for high-k material 315 may be suitable as metal M2. Metal M2 may be selected based on dipole properties of compounds it forms within chemical oxide material 315' and/or high-k material 315 to achieve a particular transistor threshold voltage modulation for a given transistor conductivity type. For example, in some PMOS embodiments, metal M2 is Al (e.g., forming a dipole as AlO$_x$, AlSiO$_x$, or AlHfO$_x$, etc.), Ga (e.g., forming a dipole species GaO$_x$, GaSiO$_x$, or GaHfO$_x$, etc.), Mo (e.g., forming a dipole species MoO$_x$, MoSiO$_x$, or MoHfO$_x$, etc.), or Co (e.g., forming a dipole species CoO$_x$, CoSiO$_x$, or CoHfO$_x$, etc.), or Ni (e.g., forming a dipole species NiO$_x$, NiSiO$_x$, or NiHfO$_x$, etc.), or Nb (e.g., forming a dipole species NbO$_x$, NbSiO$_x$, or NbHfO$_x$, etc.). In some NMOS embodiments, metal M2 is Mg (e.g., forming a dipole species s MgO$_x$, MgSiO$_x$, or MgHfO$_x$, etc.), Ca (e.g., forming a dipole species CaO$_x$, CaSiO$_x$, or CaHfO$_x$, etc.), Sr (e.g., forming a dipole species SrO$_x$, SrSiO$_x$, or SrHfO$_x$, etc.), Ba (e.g., forming a dipole species BaO$_x$, or BaSiO$_x$, BaHfO$_x$, etc.), La (e.g., forming a dipole species LaO$_x$, LaSiO$_x$, or LaHfO$_x$, etc.), Sc (e.g., forming a dipole species ScO$_x$, ScSiO$_x$, or ScHfO$_x$, etc.), or Y (e.g., forming a dipole species YO$_x$, or YSiO$_x$, YHfO$_x$, etc.), or Gd (e.g., forming a dipole species GdO$_x$, or GdSiO$_x$, GdHfO$_x$, etc.), or Er (e.g., forming a dipole species ErO$_x$, or ErSiO$_x$, ErHfO$_x$, etc.), or Yb (e.g., forming a dipole species YbO$_x$, or YbSiO$_x$, YbHfO$_x$, etc.), or Lu (e.g., forming a dipole species LuO$_x$, or Lu,SiO$_x$, LuHfO$_x$, etc.).

The dipole V$_t$ shifter comprising metal M2 may be introduced into chemical oxide material 315' and/or high-k material 315 from a solid state dopant source material that may be sacrificial. Alternatively, the source material may be retained within a RoW transistor stack as a permanent feature of a gate stack, for example as further described further below. Differing amounts of the dipole V$_t$ shifter may be introduced into various ones of the gate stacks within a RoW transistor stack structure through a selective application and/or removal of a dipole V$_t$ shifter source material. Alternatively, or in addition, differing amounts of the dipole V$_t$ shifter may be introduced into various ones of the gate stacks within a RoW transistor stack structure through the selective application and/or or removal of a diffusion barrier positioned between a source material and chemical oxide material 315' and/or high-k material 315.

Figure 4A:
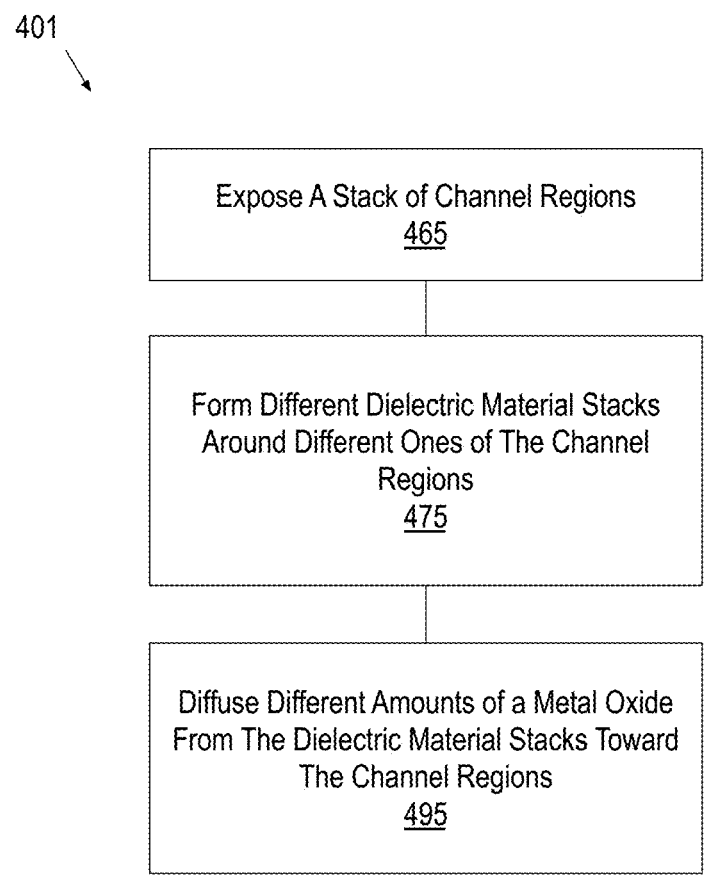
FIG. 4A is a flow diagram illustrating methods of tuning $V_t$ in a RoW transistor stack structure, in accordance with some embodiments.

FIG. 4A is a flow diagram illustrating methods 401 for selective dipole shifting of V$_t$ within a RoW transistor stack, in accordance with some embodiments. Through the practice of methods 401, transistors within a single RoW transistor stack may be set to operate at different threshold voltages. Rather than relying on a modulation of gate electrode work function, methods 401 tune dipole properties of one or more gate insulator material(s). While such dipole tuning may be combined with gate electrode work function tuning, in some embodiments a stacked transistor includes a single gate electrode workfunction metal with different threshold voltages achieved exclusively through dipole tuning methods 401. Methods 401 may be practiced to arrive at RoW transistor stack structure 100, but may also be practiced to form other RoW transistor stack structures. Similarly, methods other than methods 401 may be practiced to arrive at RoW transistor stack structure 100.

Methods 401 begin at block 465 where a vertical stack of transistor channel regions are exposed. Within the vertical stack there are multiple transistor channel regions, one over the other. The vertical stack includes at least two channel regions and may include any integer number of channel regions (e.g., 3, 4, 5 . . . 10 . . . 20, etc.). The channel regions may comprise any channel material, such as Si, Ge, or SiGe, for example. The channel regions may advantageously all comprise substantially the same channel material. The channel regions may be suitable for two transistors. In some embodiments, the channels are suitable for a CMOS transistor stacked structure having transistors of complementary conductivity type within the stack.

Methods 401 continue at block 475 where different gate insulator material stacks are formed around different ones of the channel regions. In exemplary embodiments, the dielectric material stacks all include a first metallic compound that is suitable as a high-k insulator. In addition to the first metallic compound, the dielectric material stack around at least some of the channel regions further includes a second metallic compound. Relative to the channel material, the ordering of layers of the first and second metallic compounds may vary, with one or the other being closer to the channel material. In some embodiments, a first metallic compound suitable as a high-k material may be formed over all channel regions. In further embodiments, a second metallic compound suitable as a dipole shifter may be formed over the high-k material around fewer than all of the channel regions within a stack. Alternatively, different thicknesses of the second metallic compound may be formed over the high-k material around all of the channel regions. In still other embodiments, a diffusion barrier may be formed over the high-k material, but around fewer than all of the channel regions. The second metallic compound suitable as a dipole source material may then be formed over the high-k material, and over the diffusion barrier, where present.

Methods 401 continue at block 495 where differing amounts of the dipole $V_t$ shifter are diffused toward the various channel regions of the transistor stack. In exemplary embodiments, diffusion of the dipole $V_t$ shifter is driven by elevated temperature processing. One or more thermal processes may be performed at block 495 to diffuse the dipole $V_t$ shifter toward the channel regions until it comes to rest, for example, within a chemical oxide between the first metal oxide and the channel material.

Figure 4B:
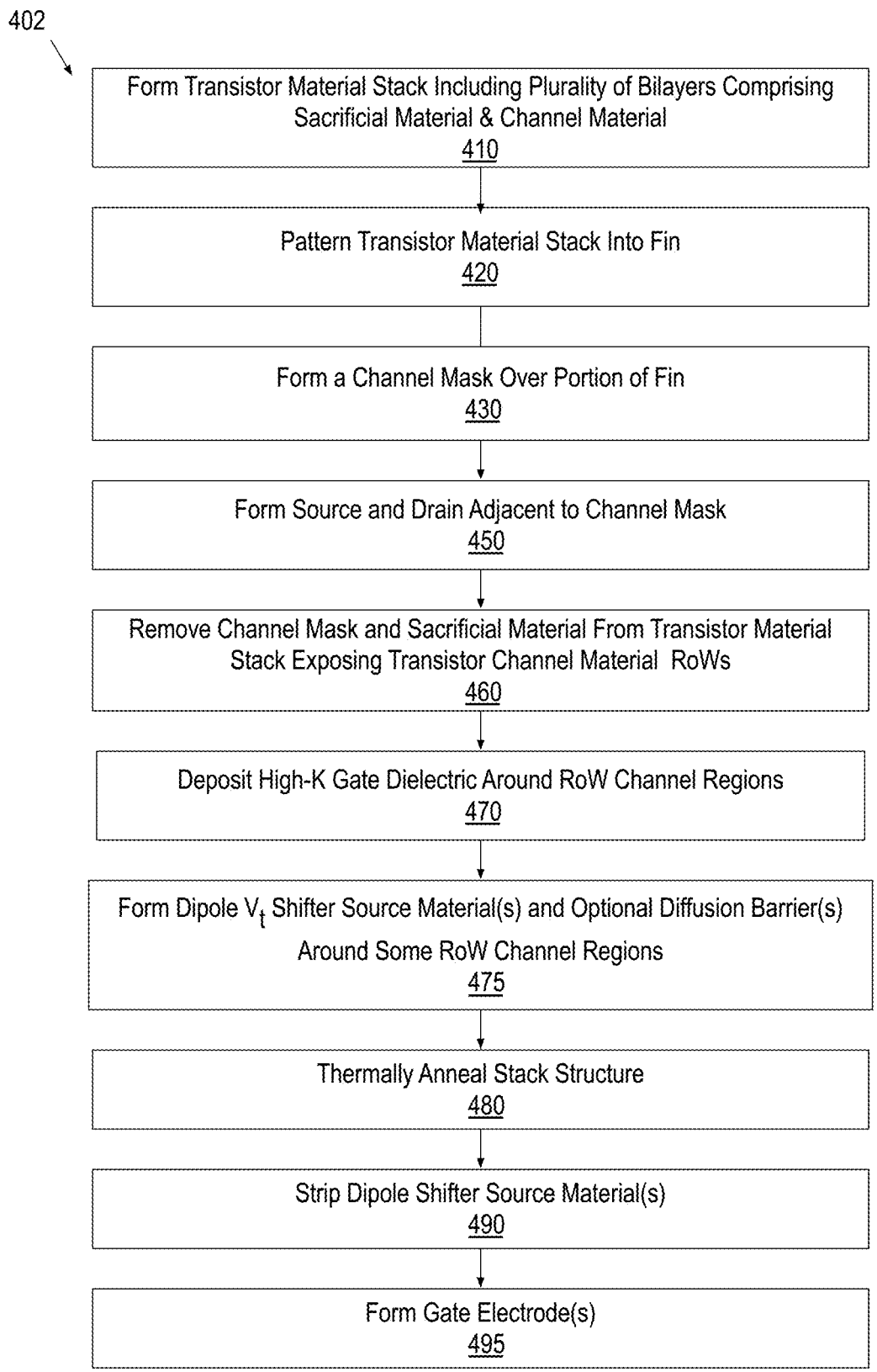
FIG. 4B is a flow diagram illustrating methods of selectively forming one or more dipole $V_t$ shifters in an RoW transistor stack structure, in accordance with some embodiments.

FIG. 4B is a flow diagram illustrating methods 402 for selectively forming one or more dipole $V_t$ shifters in an RoW transistor stack, in accordance with some embodiments. Methods 402 may be practiced in some implementations of methods 401, for example. Methods 402 begin with forming a transistor channel material stack including a plurality of bi-layers comprising a sacrificial material and a channel material over an area of substrate, such as a semiconductor wafer, that is to become in IC chip. In some embodiments, the sacrificial material layers include more germanium than the channel material. For example, where the channel material is predominantly silicon, sacrificial layers are $Si_{1-x}Ge_x$, and X may be between 0.1-0.5.

At block 420, the transistor channel material stack is patterned into a fin. Any patterning process such as, but not limited to, a spacer-based lithographic pitch-reduction patterning process may be practiced at block 420. Any subtractive etch may be practiced at block 420 to delineate features (e.g., fins) into the channel material stack. In some embodiments, a plasma etch process may be utilized to define features. The patterning process carried out at block 420 may also etch a portion of the underlying substrate (e.g., silicon).

At block 430 a portion of the features patterned at block 420 is protected with a channel mask. The channel mask may include one or more material layers. Prior to forming the channel mask, a dielectric material may be deposited over the fin of stacked channel materials, and on sidewalls of the fin. The dielectric may then be planarized so a top surface of the dielectric material is substantially coplanar with a top surface of the fin. The planar dielectric material may be recessed to a level at, or below, one or more of the channel materials in the stack. In some embodiments, the channel mask formed over exposed portions of the fin includes a sacrificial gate stack, for example further including a dielectric layer such as silicon oxide, or $Al_2O_3$, and any other material, such as, but not limited to polysilicon. Optionally, a spacer dielectric may be deposited over the channel mask and anisotropically etched to form a spacer around the channel mask.

Methods 401 continue at block 450 where source and drain regions are formed adjacent to the channel mask and/or spacer. Block 450 may include the removal of at least the sacrificial material layers between the channel materials, and may further include removal of the channel material as well. Following the channel material stack etch(es), source and drain material may be deposited or epitaxially grown in contact with the channel material layers of the fin. In some embodiments, the source and drain structures are epitaxially grown by a low pressure CVD (LPCVD) process. In PMOS embodiments, the source and drain regions include predominantly silicon or $Si_{1-x}Ge_x$, and X may be between 0.1-0.5, and one or more $p^+$ dopants, such as boron, gallium, indium, or aluminum. In NMOS embodiments, source and drain regions include predominantly silicon, and one or more n-dopants such as phosphorus, arsenic, or antimony. In CMOS embodiments, block 450 may entail iterative removal of sacrificial material layers and source drain material deposition/growth. PMOS and NMOS source and drain material of a CMOS RoW transistor stack may be contiguously grown, or grown as separate crystals isolated by an intervening amorphous material (e.g., dielectric).

Methods 401 continue at block 460 where the channel mask is removed and sacrificial material stripped from between channel regions of the exposed stack of channel materials. In some embodiments, a wet chemical etch process is utilized to remove the sacrificial layers selectively from intervening channel materials to expose the channel material as ribbon or wires (RoW). Following the exposure of RoW channel regions, methods 401 may continue with the deposition of gate insulator material at block 470, and formation of one or more dipole $V_t$ shifter source materials at block 475. Optionally, at block 475 a diffusion barrier(s) may also be formed around some of the RoW channel regions.

In some embodiments, at block 470 a high-k gate material layer is deposited by an atomic layer deposition (ALD) process. A chemical oxide may be first formed on the RoW channel regions, for example without breaking vacuum, prior to the ALD process. The chemical oxide may be formed by any of thermal oxidation, plasma-assisted oxide, UV-assisted oxidation, or thermal ALD. The oxide growth may be substantially isotropic, growing to a self-limiting thickness of 1.0 nm, for example. The subsequent ALD process similarly facilitates conformal coverage of RoW channel regions with high-k material, such as any of those described above. The ALD process may include multiple cycles with each cycle including a deposition phase, for example where a first metal precursor is deposited, followed by a coreactant phase, for example where the first metal precursor is reacted with oxygen to form a first metal oxide. One to five (or more) such cycles may be performed, for example to deposit 1.0-2.0 nm of high-k material.

In some further embodiments, a dipole $V_t$ shifter source material is similarly deposited with an ALD process at block 475. The ALD process may again include multiple cycles with each cycle including a deposition phase, for example where a second metal precursor is deposited, followed by a coreactant phase, for example where the second metal precursor is reacted with oxygen to form a second metal oxide. One to five (or more) such cycles may be performed, for example to deposit 1.0-2.0 nm of dipole shifter source material.

In some embodiments, a diffusion barrier is formed at block 475, for example to be between the high-k material at the channel material. Deposition of diffusion barrier may therefore be subsequent to ALD of the high-k material, and prior to ALD of the dipole shifter source material, for example. Formation of the diffusion barrier is to be selective to only those channel regions of transistors that are to have a lesser amount of the dipole $V_t$ shifter within their gate stacks. Deposition of the diffusion barrier may again be with an ALD process at block 475. The ALD process may again include multiple cycles with each cycle including a deposition phase, for example where a third metal precursor including a metal such as, but not limited to, Mo, W, Nb, Ta or Ti, is deposited. Following the deposition phase, in a coreactant phase the third metal precursor is reacted, for example with nitrogen to form a metal nitride (e.g., MoN, WN, TaN NbN, or TiN). One to five (or more) such cycles may be performed, for example to deposit 1.0-2.0 nm of a diffusion barrier.

Methods 401 continue at block 480 where the stack structure is thermally annealed. Block 480 may, for example, include a heat cycle during which the stack structure reaches a temperature of over 500° C. (e.g., 700° C., 750° C., 800° C., or 850° C.) for a predetermined time in the presence of any suitable ambient, such as, but not limited to, nitrogen ($N_2$), or forming gas ($N_2$:$H_2$).

Following a thermal drive-in of the dipole $V_t$ shifter, the dipole shifter source material(s) may be stripped as sacrificial at block 490. Any suitable chemical etch process selective to the dipole shifter source material may be practiced at block 490. As noted above, removal of the dipole shifter source material is optional and block 490 may be skipped assuming retention of the dipole shifter source material poses no issue for subsequent fabrication (e.g., gate electrode formation) and/or transistor operation.

Methods 402 continue at block 495 where one or more gate electrodes are formed around the gate insulators. In some embodiments, gate electrode formation includes deposition of one or more work function metals. The work function metal may be deposited by ALD or chemical vapor deposition (CVD), for example. Gate electrode formation may further include deposition of fill metal, such as, but not limited to, W. Deposition of the fill metal may be by ALD or CVD, for example. Gate electrode formation may further include deposition of a diffusion barrier, such as, but not limited to TiN, MoN, WN, TaN, or NbN. The diffusion barrier may be deposited between the work function metal and at least one of the gate insulator and the fill metal (i.e., on either side of the work function metal).

Following block 495, the RoW transistor stack is substantially complete and may be interconnected with other RoW transistor stacks through one or more levels of interconnect metallization according to any backend of line (BEOL) fabrication processes known to be suitable for integrated circuits (ICs).

Figure 5:
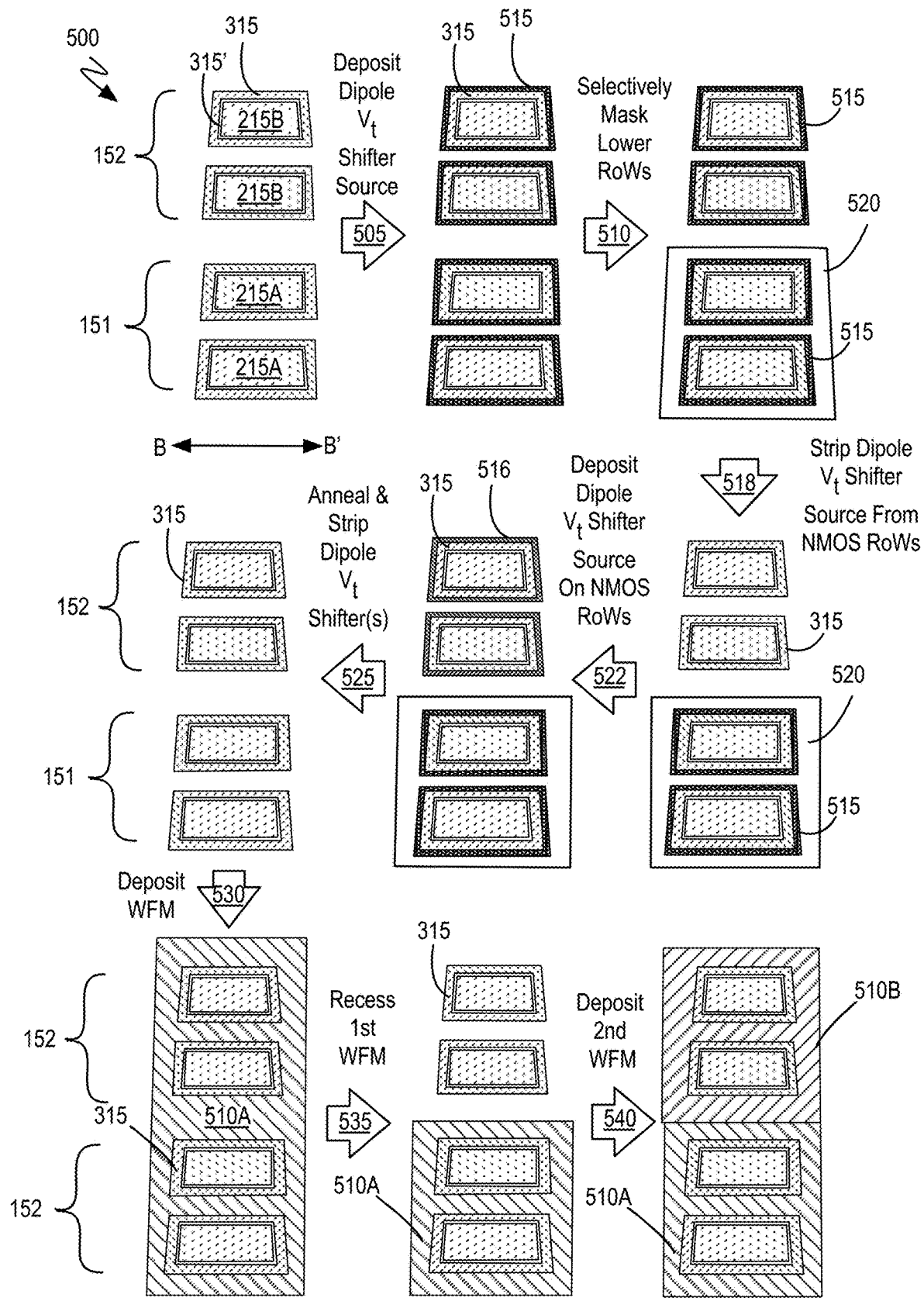
FIG. 5 illustrates a cross-sectional view of a RoW transistor stack structure evolving as blocks in the methods introduced in FIG. 4B are practiced in accordance with some embodiments.

FIG. 5 illustrates a cross-sectional view of a RoW transistor stack structure 500 along the B-B' line introduced in FIG. 1 evolving as methods 402 are practiced in accordance with some embodiments. FIG. 5 further illustrates how dipole shifter source material may be selectively formed around some channel regions of a stacked structure. RoW transistor stack structure 500 shares many of the structural elements described above for RoW transistor structure 100. The reference numbers introduced in FIG. 1, FIG. 2A and FIG. 2B are retained in FIG. 5 for structural features in RoW transistor stack structure 500 that have a direct analog in RoW transistor stack structure 100.

As shown, at operation 505, a dipole $V_t$ shifter source material 515 (e.g., P-type) is deposited in contact with high-k material 315. The lower channel regions 215A (e.g., PMOS RoWs) are then selectively masked at operation 510 with a dielectric material 520. Dielectric material 520 is sacrificial and therefore may have any composition convenient to fabrication, such as, but not limited to a carbon-based (e.g., DLC) hardmask material. The selective mask process may, for example, entail deposition of dielectric material 520, planarization of dielectric material 520 with a top of RoW transistor stack structure 500, and a partial etch back of dielectric material 520 to expose dipole $V_t$ shifter source material 515 that is around only the upper channel regions 215B (e.g., NMOS RoWs).

As further shown in FIG. 5, at operation 518 the dipole $V_t$ shifter source material is stripped from the upper channel region 215B, re-exposing high-k material 315. Optionally, a different dipole $V_t$ shifter source material 516 (e.g., N-type) may then be deposited over the exposed high-k material 315 at operation 522. Dielectric material 520 may then be stripped, and RoW stack structure 500 annealed at operation 525 to diffuse dipole dopants from dipole $V_t$ shifter source material 515 (and dipole $V_t$ shifter source material 516, if present).

As further shown in FIG. 5, at operation 530, a workfunction metal 510A (e.g., P-type) is deposited over the gate insulator(s) of all RoWs. Workfunction metal 510A may be planarized with a top surface of RoW transistor stack 500 and recessed at operation 535 to expose the upper RoW transistors 152. At operation 540, another workfunction metal 510B (e.g., N-type) is deposited over the gate insulator (s) of the upper RoWs. Workfunction metals 510A and 510B may each be any of the metals described above for workfunction metals of gate electrode 110, for example. The gate stacks of RoW transistor stack structure 500 are substantially complete with the fabrication of source and drain region, which may have been performed prior to operation 505, or performed subsequent to operation 540, as embodiments are not limited in this respect.

Figure 6:
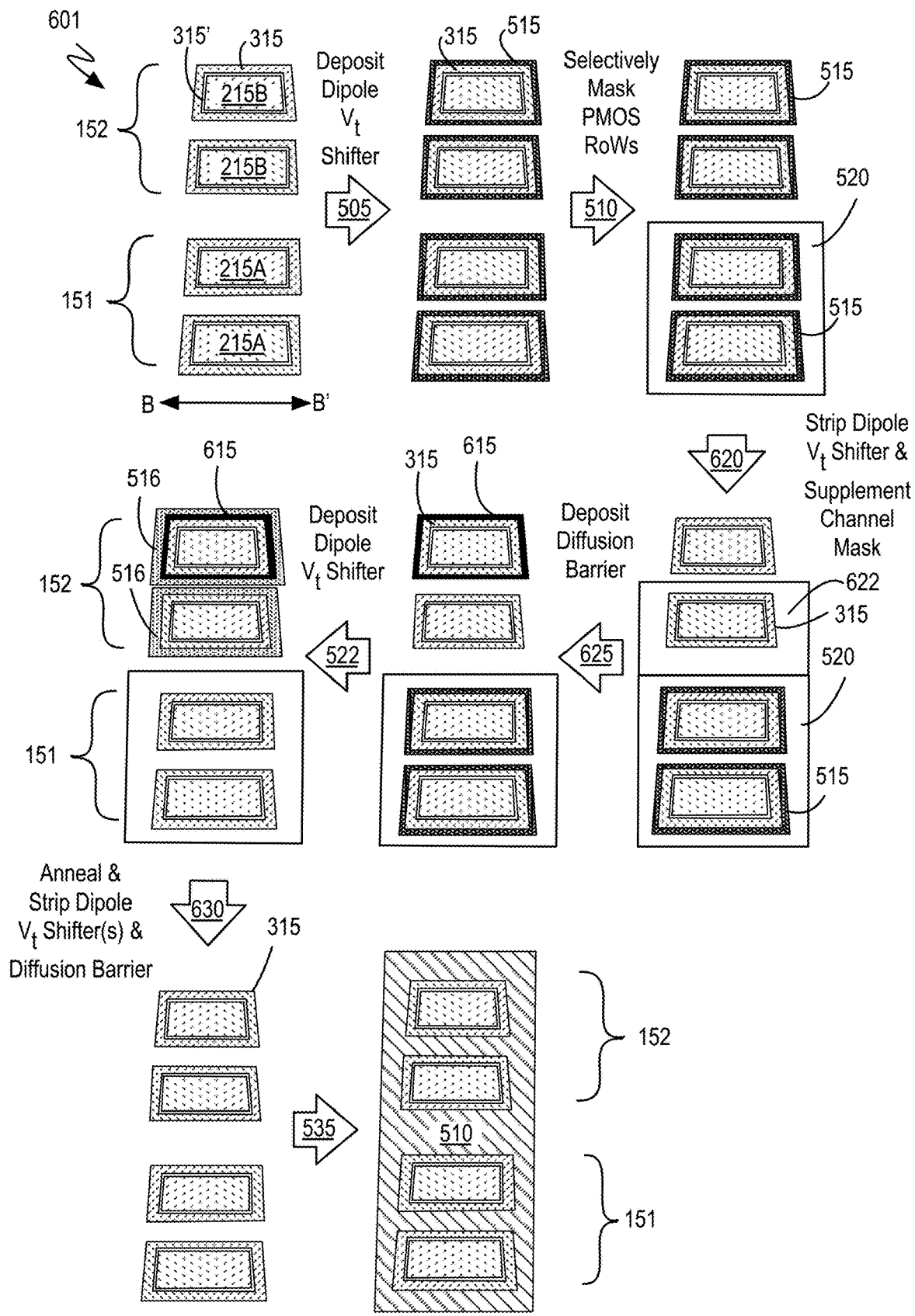
FIG. 6 illustrates a cross-sectional view of a RoW transistor stack structure evolving as blocks in the methods introduced in FIG. 4B are practiced in accordance with some alternative embodiments.

FIG. 6 illustrates a cross-sectional view of a RoW transistor stack structure 601 along the B-B' line introduced in FIG. 1 evolving as methods 402 are practiced in accordance with some alternative embodiments. FIG. 6 further illustrates how dipole shifter source material may be selectively formed around some channel regions of a stacked structure through the formation of a diffusion barrier. RoW transistor stack structure 601 shares many of the structural elements described above for RoW transistor structure 100. The reference numbers introduced in FIG. 1, FIG. 2A and FIG. 2B are retained in FIG. 6 for structural features in RoW transistor stack structure 601 that have a direct analog in RoW transistor stack structure 100.

As shown in FIG. 6, a dipole $V_t$ shifter source material 515 (e.g., P-type) is deposited over high-k material 315 at operation 505. The lower channel regions 215A (e.g., PMOS RoWs) are then selectively masked at operation 510 with dielectric material 520. Dipole $V_t$ shifter source material 515 is then stripped from around the upper channel regions 215B and dielectric material 520 is supplemented with an additional thickness of dielectric material 620 to cover one of upper channel regions 215B (e.g., an NMOS RoW).

At operation 625 a diffusion barrier 615 is deposited around the remaining channel regions 215B not covered by dielectric material 620. Diffusion barrier 615 may be any of the materials described above (e.g., TaN, TiN, etc.), for example. Following deposition of diffusion barrier 615, dielectric material 620 may be etched back, for example selectively to dielectric material 520. Dipole $V_t$ shifter source material (e.g., N-type) 516 may then be deposited around exposed channel regions 215B.

An anneal at operation 630 will then drive dipole dopant from source materials 515 and 516 into respective ones of channel regions 215A and 215B with less dipole dopant diffusion driven toward those channel regions protected by diffusion barrier 615. Hence, between multiple RoW transistors 152 (all N-type) the dipole dopant concentration within the gate insulator materials(s) varies, and RoW transistors 152 may have therefore have different threshold voltages. Following the anneal, any (or all) of the dipole source materials 515 and 516 may then be stripped at operation 630. Diffusion barrier 615 may be similarly stripped.

As further shown in FIG. 6, at operation 535, a single workfunction metal 510 is deposited over the gate insulators of all RoWs 151 and 152. Alternatively, multiple workfunction metals may be deposited. One or more of a diffusion barrier and a fill metal (not depicted) may also be further deposited as part of a gate electrode stack.

FIGS. 7A, 7B, 7C, 7D, 7E and 7F illustrate cross-section views of ROW transistor stacks along the B-B' line introduced in FIG. 1 in accordance with some embodiments. The RoW transistor stack structures 701-706 share many of the structural elements described above for RoW transistor structures 100, 500 and 601. The reference numbers introduced in FIG. 1, FIG. 2A, FIG. 2B, FIG. 5 or FIG. 6 are retained in FIG. 7 for structural features that have a direct analog in RoW transistor stack structures previously described.

FIG. 7A illustrates a RoW transistor stack structure 701 that includes a homogeneous workfunction metal around channels of all RoW transistors 151 and 152. The gate stack around each of RoW transistors 151, 152 further comprises chemical oxide material layer 315' and high-k material layer 315, for example substantially described above where at least one of these gate insulators includes a dipole $V_t$ shifter. Although the dipole $V_t$ shifter content varies between at least channel regions 215A and 215B, it may further vary between individual ones of channel regions 215A and/or 215B. Aside from the different dipole $V_t$ shifter content within one of more of the gate insulator materials 315', 315 there are no other differences in the gate insulator stacks. For example, any dipole $V_t$ shifter source material and/or diffusion barrier that may have been employed in the fabrication of RoW transistor stack 701 has been removed as a sacrificial material. Nevertheless, a basis for a threshold voltage difference between RoW transistors 151 and 152 may be deduced by detecting the dipole metal with chemical analysis of gate insulator materials 315', 315, for example by STEM-EELS (electron energy-loss spectroscopy)/EDS (energy dispersive x-ray spectroscopy). In stack structure 701, the gate electrode includes only a single workfunction metal 510.

FIG. 7B illustrates a RoW transistor stack structure 702 that includes a two (heterogeneous) workfunction metals 710A and 710B around channels 215A, 215B, respectively. The gate stack around each of RoW transistors 151, 152 further comprises chemical oxide material 315' and high-k material 315, for example substantially described above where at least one of these gate insulators includes a dipole $V_t$ shifter. $V_t$ shifter content may again vary between channel regions 215A and 215B as well as across individual ones of channel regions 215A and/or 215B. Any dipole $V_t$ shifter source material and/or diffusion barrier that may have been employed in the fabrication of RoW transistor stack 702 to supplement workfunction metals 710A and 710B has been removed as a sacrificial material. However, chemical analysis of insulator materials 315', 315 may nevertheless readily identify the metal species associated any dipole shifters present.

FIG. 7C illustrates a RoW transistor stack structure 703 that again includes a single (homogeneous) workfunction metal 510. Diffusion barrier 615 has been retained around channel regions 215A, and the absence of diffusion barrier 615 is indicative of a selective introduction of a dipole $V_t$ shifter within gate insulator materials 315', 315 around channel regions 215B.

FIG. 7D illustrates a RoW transistor stack structure 704 that includes a single (homogeneous) workfunction metal around a gate insulator stack that includes a dipole shifter source material 415 surrounding only channel regions 215B. Structure 704 is illustrative of an embodiment where the dipole shifter source material is not fully sacrificial. Structure 704 may be differentiated from other multi-layered gate insulator structures through chemical analysis of gate insulator materials 315', 315 that identifies a metal of dipole shifter source material 415 to also be within chemical oxide material 315' and/or high-k material 315.

FIG. 7E illustrates a RoW transistor stack structure 705 that similarly includes a dipole shifter source material 415 surrounding only channel regions 215B. In this example however, dipole shifter source material 415 is between chemical oxide material 315' and high-k material 315. Structure 705 may be differentiated from a multi-layered gate insulator structure by a chemical analysis of gate insulator layers 315', 315. Identification of the metal species from dipole shifter source material 415 located within chemical oxide material 315' and/or high-k material 315 around channel regions 215B, but absent from those insulators around channel regions 215A, would deduce the function of dipole shifter source material 415.

FIG. 7F illustrates a RoW transistor stack structure 706 that similarly includes a dipole shifter source material 415, but only around a subset of channel regions 215B. A difference in threshold voltages between RoW transistors 152 may therefore be attributed to dipole shifter source material 415, particularly where chemical analysis of gate insulator materials 315', 315 identify the metal species from dipole shifter source material 415 to also be within chemical oxide material 315' and/or high-k material 315 around channel regions 215B, but absent from the dielectrics around channel regions 215A.

Figure 8:
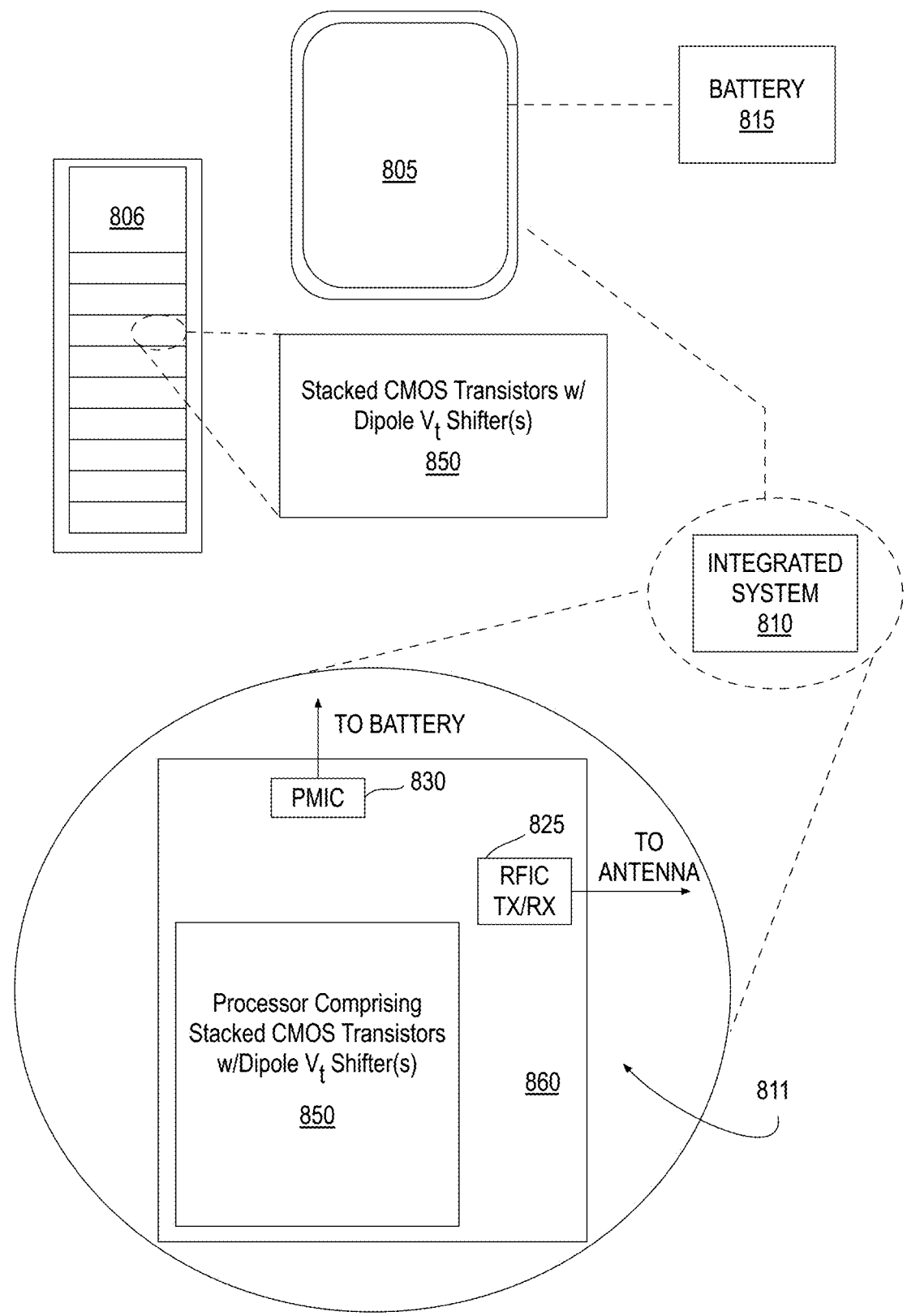
FIG. 8 illustrates a mobile computing platform and a data server machine employing an IC including RoW transistor stack structures with one or more dipole $V_t$ shifters, in accordance with embodiments.

The RoW transistor stack structures with varying threshold voltage, and the methods of forming such structures described herein may be integrated into a wide variety of ICs and computing systems that include such ICs. FIG. 8 illustrates a system in which a mobile computing platform 805 and/or a data server machine 806 employs an IC having a memory and/or microprocessor IC with RoW transistor stack structures including a dipole $V_t$ shifter, for example in accordance with some embodiments described elsewhere herein. The server machine 806 may be any commercial server, for example including any number of high-performance computing platforms within a rack and networked together for electronic data processing, which in the exemplary embodiment includes a monolithic IC 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level integrated system 810, and a battery 815.

Whether disposed within the integrated system 810 illustrated in the expanded view 811, or as a stand-alone packaged chip within the server machine 806, IC 850 may include memory circuitry (e.g., RAM), and/or a logic circuitry (e.g., a microprocessor, a multi-core microprocessor, graphics processor, or the like). At least one of these circuitries further includes one or more RoW transistor stack structures including a dipole $V_t$ shifter, for example in accordance with some embodiments described elsewhere herein. IC 850 may be further coupled to a board or package substrate 860 that further hosts one or more additional ICs, such as power management IC 830 and radio frequency IC 825. RFIC 825 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
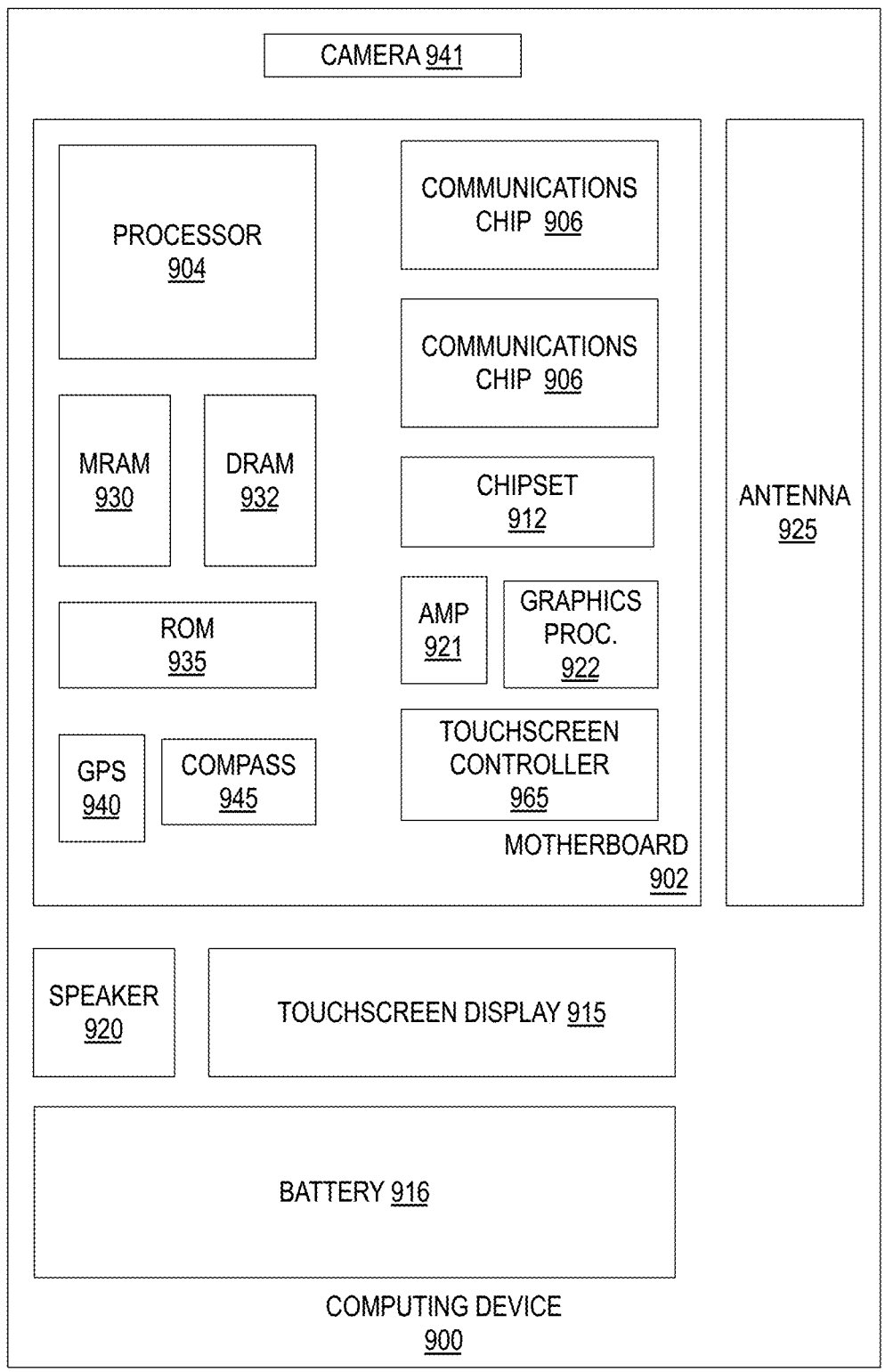
FIG. 9 is a functional block diagram of an electronic computing device, in accordance with some embodiments.

FIG. 9 is a functional block diagram of an electronic computing device 900, in accordance with some embodiments. Device 900 further includes a motherboard 902 hosting a number of components, such as, but not limited to, a processor 904 (e.g., an applications processor). Processor 904 may be physically and/or electrically coupled to motherboard 902. In some examples, processor 904 is part of an IC including one or more RoW transistor stack structures including a dipole $V_t$ shifter, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor stack comprises a first channel region over a second channel region. The first and the second channel regions comprise at least one of Si or Ge. The structure comprises a gate electrode around the first channel region, and around the second channel region. A first gate insulator material is between the gate electrode and each of the first channel region and the second channel region. The first gate insulator material comprises oxygen and a first metal. The transistor stack structure further comprises a second gate insulator material between the first gate insulator material and the first channel region. The transistor stack structure further comprises a third gate insulator material between the first gate insulator material and the second channel region. Both of the second and the third gate insulator materials comprise oxygen and the at least one of Si or Ge. At least one of the second and third gate insulator materials comprise a second metal; and an amount of the second metal varies between the second and third gate insulator materials.

In second examples, for any of the first examples the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

In third examples, for any of the first through second examples the first channel material and the second channel region have substantially the same composition, a first transistor comprises the first channel region and the first transistor has a first threshold voltage, and a second transistor comprises the second channel material and the second transistor has a second threshold voltage.

In fourth examples, for any of the first through third examples the second metal is present in both the second gate insulator material and the third gate insulator material.

In fifth examples, for any of the first through fourth examples the transistor stack further comprises a first source material coupled to a first drain material through the first channel region. The first source material and the first drain material are of a first conductivity type. The stack further comprises a second source material coupled to a second drain material through the second channel region, wherein the second source material and the second drain material are of a second conductivity type, complementary to the first conductivity type.

In sixth examples, for any of the fifth examples the first conductivity type is P-type, and the second conductivity type is N-type, and the second metal is present in only one of the second gate insulator material or the third gate insulator material.

In seventh examples, for any of the sixth examples the second metal is Al, Ga, Mo, Co, Ni, or Nb and the amount of the second metal is greater in the second gate insulator material than in the third gate insulator material. Alternatively, the second metal is Mg, Ca, Sr, Ba, La, Sc, Y, Gd, Er, Yb, or Lu, and the amount of the second metal is greater in the third gate insulator material than in the second gate insulator material.

In eighth examples, for any of the first through seventh examples the transistor stack further comprises a diffusion barrier. The first gate insulator material is between the diffusion barrier and at least one of the first channel region or the second channel. The diffusion barrier comprises a third metal and nitrogen.

In ninth examples, for any of the eighth examples the third metal is Mo, Nb, Ti or W.

In tenth examples, for any of the first through ninth examples the transistor stack further comprises a fourth gate insulator material around at least one of the first channel region or the second channel region, wherein the fourth gate insulator material comprises oxygen and the second metal.

In eleventh examples, for any of the tenth examples the fourth gate insulator material is between the first gate insulator and the gate electrode.

In twelfth examples, for any of the eleventh examples the fourth gate insulator material is between the first gate insulator material and at least one of the second or third gate insulator materials.

In thirteenth examples, for any of the first through twelfth examples the gate electrode comprises a work function metal around at least the first channel region and in physical contact with the first gate insulator material.

In fourteenth examples, for any of the thirteenth examples the gate electrode further comprises a second work function metal around the second channel region and in physical contact with the first gate insulator material.

In fifteenth examples, a computer system comprises a power supply; and an IC die coupled to the power supply. The IC die comprises an integrated circuit (IC) structure comprising a CMOS transistor stack. The CMOS transistor stack comprises a first channel region of a first conductivity type over a second channel region of a second conductivity type, complementary to the first, wherein the first and the second channel regions comprise at least one of Si or Ge. The CMOS transistor stack comprises a gate electrode around the first channel region, and around the second channel region. The CMOS transistor stack comprises a first gate insulator material between the gate electrode and each of the first channel region and the second channel region. The first gate insulator material comprises oxygen and a first metal. The CMOS transistor stack comprises a second gate insulator material between the first gate insulator material and the first channel region, and a third gate insulator material between the first gate insulator material and the second channel region. Both of the second and the third gate insulator materials comprise oxygen and the at least one of Si or Ge. At least one of the second and third gate insulator materials comprise a second metal, and an amount of the second metal varies between the second and third gate insulator materials.

In sixteenth examples, for any of the fifteenth examples the first conductivity type is P-type, and the second conductivity type is N-type. The second metal is Al, Ga, Mo, Co, Ni, or Nb, the second gate insulator material comprises the second metal, and the second metal is absent from the third gate insulator material. Alternatively, the second metal is Mg, Ca, Sr, Ba, La, Sc, Y, Gd, Er, Yb, or Lu, the third gate insulator material comprises the second metal, and the second metal is absent from the second gate insulator material.

In seventeenth examples, for any of the fifteenth through sixteenth examples the system comprises a battery coupled to the power supply.

In eighteenth examples, a method of fabricating transistor stack comprises exposing a first channel region over a second channel region, wherein the first and the second channel regions comprise at least one of Si or Ge. The method comprises depositing a gate insulator material around the first channel region and around the second channel region. The gate insulator material comprises oxygen and a first metal. The method comprises forming a $V_t$ shifting material around at least one of the first channel region or the second channel region. The $V_t$ shifting material comprises a second metal and oxygen. The method comprises diffusing the second metal from the $V_t$ shifting material, toward at least one of the first or second channel regions.

In nineteenth examples, for any of the eighteenth examples a first transistor comprises the first channel region and the first channel region has a first conductivity type. A second transistor comprises the second channel region and the second channel region has a second conductivity type, complementary to the first conductivity type. Forming the $V_t$ shifting material comprises depositing the $V_t$ shifting material with 1-10 atomic layer deposition (ALD) cycles, and the method further comprises removing the $V_t$ shifting material after the diffusing, and depositing a gate electrode around the first channel region and around the second channel region with the gate insulator material therebetween.

In twentieth examples, for any of the eighteenth through nineteenth examples the diffusing further comprises performing a thermal anneal at a temperature of at least 700° C.

In twenty-first examples, for any of the eighteenth through twentieth examples the method comprises depositing a mask material over the $V_t$ shifting material, removing a portion of the mask material to expose a portion of the $V_t$ shifting material that is around only one of the first or second channel regions, and removing the portion of the $V_t$ shifting material prior to the diffusing.

In twenty-second examples, for any of the twenty-first examples the method comprises forming a diffusion barrier in direct contact with the gate insulator material, and around only one of the first or second channel regions. Depositing the $V_t$ shifting material comprising depositing the $V_t$ shifting material in direct contact with diffusion barrier and in direct contact with the gate insulator material where the diffusion barrier is absent.

In twenty-third examples for any of the twenty-second examples forming the diffusion barrier further comprises depositing a compound of nitrogen and Mo, Nb, W, or Ti by ALD around both the first and second channel regions and selectively removing the diffusion barrier from one of the first or second channel regions. Alternatively forming the diffusion barrier further comprises masking one of the first or second channel regions, depositing the compound of nitrogen and Mo, Nb, W or Ti around an unmasked one of the first and second channel regions, and subsequently unmasking the one of the first or second channel regions.

In twenty-fourth examples, for any of the twenty-second examples the method further comprises removing the diffusion barrier prior to depositing the gate electrode.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor stack structure, comprising:
   a first channel region over a second channel region, wherein the first and the second channel regions comprise at least one of Si or Ge;
   a gate electrode around the first channel region, and around the second channel region;
   a first gate insulator material between the gate electrode and each of the first channel region and the second channel region, wherein the first gate insulator material comprises oxygen and a first metal and encircles each of the first channel region and the second channel region;
   a second gate insulator material in direct contact with the first channel region, and between the first channel region and the first gate insulator material encircling the first channel region; and
   a third gate insulator material in direct contact with the second channel region, between the second channel region and the first gate insulator material encircling the second channel region, wherein:
      both of the second and the third gate insulator materials comprise oxygen and the at least one of Si or Ge;
      at least one of the second and third gate insulator materials comprise a second metal; and
      an amount of the second metal varies between the second and third gate insulator materials.

2. The transistor stack of claim 1, wherein the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

3. The transistor stack of claim 1, wherein:
   the first channel region and the second channel region have substantially the same composition;
   a first transistor comprises the first channel region and the first transistor has a first threshold voltage; and
   a second transistor comprises the second channel material and the second transistor has a second threshold voltage, different than the first threshold voltage.

4. The transistor stack of claim 1, wherein the second metal is present in both the second gate insulator material and the third gate insulator material.

5. The transistor stack of claim 1, further comprising:
   a first source material coupled to a first drain material through the first channel region, wherein the first source material and the first drain material are of a first conductivity type;
   a second source material coupled to a second drain material through the second channel region, wherein the second source material and the second drain material are of a second conductivity type, complementary to the first conductivity type.

6. The transistor stack of claim 5, wherein:
   the first conductivity type is P-type, and the second conductivity type is N-type; and
   the second metal is present in only one of the second gate insulator material or the third gate insulator material.

7. The transistor stack of claim 6, wherein:
   the second metal is Al, Ga, Mo, Co, Ni, or Nb and the amount of the second metal is greater in the second gate insulator material than in the third gate insulator material; or
   the second metal is Mg, Ca, Sr, Ba, La, Sc, Y, Gd, Er, Yb, or Lu, and the amount of the second metal is greater in the third gate insulator material than in the second gate insulator material.

8. The transistor stack of claim 1, further comprising a diffusion barrier, wherein the first gate insulator material is between the diffusion barrier and at least one of the first channel region or the second channel, and wherein the diffusion barrier comprises a third metal and nitrogen.

9. The transistor stack of claim 8, wherein the third metal is Mo, Nb, Ti or W.

10. The transistor stack of claim 1, further comprising a fourth gate insulator material around at least one of the first channel region or the second channel region, wherein the fourth gate insulator material comprises oxygen and the second metal.

11. The transistor stack of claim 10, wherein the fourth gate insulator material is between the first gate insulator and the gate electrode.

12. The transistor stack of claim 11, wherein the fourth gate insulator material is between the first gate insulator material and at least one of the second or third gate insulator materials.

13. The transistor stack of claim 1, wherein the gate electrode comprises a work function metal around at least the first channel region and in physical contact with the first gate insulator material.

14. The transistor stack of claim 13, wherein the gate electrode further comprises a second work function metal around the second channel region and in physical contact with the first gate insulator material.

15. A computer system, comprising:
   a power supply; and
   an IC die coupled to the power supply, the IC die comprising an integrated circuit (IC) structure comprising a CMOS transistor stack, wherein the CMOS transistor stack comprises:
      a first channel region of a first conductivity type over a second channel region of a second conductivity type, complementary to the first, wherein the first and the second channel regions comprise at least one of Si or Ge;
      a gate electrode around the first channel region, and around the second channel region;
      a first gate insulator material between the gate electrode and each of the first channel region and the second channel region, wherein the first gate insulator material comprises oxygen and a first metal and encircles each of the first channel region and the second channel region;
      a second gate insulator material in direct contact with the first channel region, and between the first channel region and the first gate insulator material encircling the first channel region; and a third gate insulator material in direct contact with the second channel region, and between the second channel region and the first gate insulator material encircling the second channel region, wherein:
  both of the second and the third gate insulator materials comprise oxygen and the at least one of Si or Ge;
  at least one of the second and third gate insulator materials comprise a second metal; and
  an amount of the second metal varies between the second and third gate insulator materials.

16. The computer system of claim 15, wherein the first conductivity type is P-type, and the second conductivity type is N-type; and wherein:
  the second metal is Al, Ga, Mo, Co, Ni, or Nb, the second gate insulator material comprises the second metal, and the second metal is absent from the third gate insulator material; or
  the second metal is Mg, Ca, Sr, Ba, La, Sc, Y, Gd, Er, Yb, or Lu, the third gate insulator material comprises the second metal, and the second metal is absent from the second gate insulator material.

17. The computer system of claim 15, further comprising a battery coupled to the power supply.

18. A transistor stack structure, comprising:
  a first channel region over a second channel region, wherein the first and the second channel regions comprise at least one of Si or Ge;
  a gate electrode around the first channel region, and around the second channel region;
  a first source material coupled to a first drain material through the first channel region, wherein the first source material and the first drain material are of a first conductivity type;
  a second source material coupled to a second drain material through the second channel region, wherein the second source material and the second drain material are of a second conductivity type, complementary to the first conductivity type;
  a first gate insulator material between the gate electrode and each of the first channel region and the second channel region, wherein the first gate insulator material comprises oxygen and a first metal and encircles each of the first channel region and the second channel region;
  a second gate insulator material in direct contact with the first channel region, and between the first channel region and the first gate insulator material encircling the first channel region, and in direct contact with the first channel region; and
  a third gate insulator material in direct contact with the second channel region, between the second channel region and the first gate insulator material encircling the second channel region, wherein:
    both of the second and the third gate insulator materials comprise oxygen and the at least one of Si or Ge;
    at least one of the second and third gate insulator materials comprise a second metal; and
    the second metal is Al, Ga, Mo, Co, Ni, or Nb and an amount of the second metal is greater in the second gate insulator material than in the third gate insulator where the first conductivity type is P-type, and the amount of the second metal is greater in the third gate insulator material than in the second gate insulator material where the first conductivity type is N-type, or the second metal is Mg, Ca, Sr, Ba, La, Sc, Y, Gd, Er, Yb, or Lu, and an amount of the second metal is greater in the second gate insulator material than in the third gate insulator where the first conductivity type is N-type, and the amount of the second metal is greater in the third gate insulator material than in the second gate insulator material where the first conductivity type is P-type.

19. The transistor stack structure of claim 18, wherein:
  the first conductivity type is P-type, and the second conductivity type is N-type;
  the second metal is Al, Ga, Mo, Co, Ni, or Nb; and
  the second metal is present in only the second gate insulator material.

20. The transistor stack structure of claim 18, wherein:
  the first conductivity type is P-type, and the second conductivity type is N-type;
  the second metal is Mg, Ca, Sr, Ba, La, Sc, Y, Gd, Er, Yb, or Lu; and
  the second metal is present in only the third gate insulator material.

21. The transistor stack structure of claim 18, wherein:
  the first conductivity type is N-type, and the second conductivity type is P-type;
  the second metal is Al, Ga, Mo, Co, Ni, or Nb; and
  the second metal is present in only the third gate insulator material.

* * * * *